United States Patent [19]

Lai

[11] Patent Number: 5,563,893

[45] Date of Patent: Oct. 8, 1996

[54] INTEGRATED LEVEL DETECTOR

[75] Inventor: Benny W. Lai, San Jose, Calif.

[73] Assignee: Hewlett-Packard Company, Palo Alto, Calif.

[21] Appl. No.: 608,208

[22] Filed: Feb. 28, 1996

Related U.S. Application Data

[63] Continuation of Ser. No. 195,243, Feb. 14, 1994, abandoned.

[51] Int. Cl.[6] .................................................. H03M 13/00
[52] U.S. Cl. .................................................. 371/6; 360/39
[58] Field of Search .......................... 371/6, 65, 57.1; 359/110, 155, 177; 250/214 R; 360/38.1, 41, 39

[56] References Cited

U.S. PATENT DOCUMENTS

| | | | |
|---|---|---|---|
| 4,439,848 | 3/1984 | Ceshkovsky et al. | |
| 4,545,055 | 10/1985 | Patel | 371/57.1 |
| 4,716,323 | 12/1987 | Wada et al. | 371/66 |
| 4,727,592 | 2/1988 | Okada et al. | 371/4 |
| 4,750,179 | 6/1988 | Davidon et al. | 371/57.1 |
| 4,800,564 | 1/1989 | DeFazio et al. | 371/61 |
| 4,813,044 | 3/1989 | Kumar et al. | 371/57.1 |
| 4,841,232 | 6/1989 | Graham et al. | 371/6 |
| 4,893,002 | 1/1990 | Kollanyi | 250/214 R |
| 4,922,493 | 5/1990 | Kase | 371/6 |
| 4,946,244 | 8/1990 | Schembri | 350/96.16 |
| 4,962,509 | 10/1990 | Itoh | 371/57.1 |
| 5,055,707 | 10/1991 | Beard | 371/61 |
| 5,138,636 | 8/1992 | Bardin | 371/65 |
| 5,144,469 | 9/1992 | Brahms et al. | 371/57.1 |
| 5,259,041 | 11/1993 | Kato et al. | 382/48 |
| 5,267,325 | 11/1993 | Barron et al. | 282/48 |
| 5,293,384 | 3/1994 | Keeley et al. | 371/16.3 |
| 5,315,597 | 5/1994 | Yang et al. | 371/65 |
| 5,400,341 | 3/1995 | Makino et al. | 371/12 |
| 5,428,471 | 6/1995 | McDermott | 359/177 |

OTHER PUBLICATIONS

Schilling et al. "Electronic Circuit", Mc Graw Hill, textbook, 1989.

Esman et al. "Feedback Induced Microwave Signal Dropout in 0.83 μm Fibre-optic links".

*Primary Examiner*—Robert W. Beausoliel, Jr.
*Assistant Examiner*—Albert Décady
*Attorney, Agent, or Firm*—Jonathan B. Penn

[57] ABSTRACT

A digital loss-of-signal ("LOS") detector having a trough circuit and a smearing circuit is described. The trough circuit generates a logic output whenever an incoming communication signal is within a predefined voltage range. The output of the trough circuit is applied to the smearing circuit, which generates an LOS output whenever the output of the trough circuit remains at a predefined logic level for a predetermined length of time. In a second embodiment, a state machine is coupled to the output of the smearing circuit, the trough circuit, and a clock, the state machine generating the LOS indication if the output from the smearing circuit remains at the predetermined logic level for at least a predetermined number of clock cycles.

8 Claims, 6 Drawing Sheets

INTEGRATED LEVEL DETECTOR

CROSS REFERENCE TO RELATED APPLICATION

This is a continuation of application Ser. No. 08/195,243 filed on Feb. 14, 1994, now abandoned.

The present invention relates to fiber optic communication systems. More particularly, it relates to the detection of a loss-of-signal ("LOS") event in a fiber-optic communications system.

In most, if not all digital communications systems, the receiver must be able to detect the presence or absence of an incoming signal. Rapid detection of an LOS event permits equally rapid restarting of the system.

In high speed fiber optic communications systems, a signal is transmitted as a series of laser light pulses over an optical fiber. If a break in the fiber is undetected, laser light could strike someone in the eye, with serious consequences. In many known duplex systems, when the receiver detects an LOS event, the receiver shuts down its own laser light, which in turn causes the transmitter to shut down. This prevents possible eye injury.

Although the receiver must respond quickly and correctly to a true LOS event, it must not shut down because of small variations in the strength of the incoming signal. Avoiding unnecessary shutdowns due to these signal variations requires very precise control of the threshold of the receiver's level detector. Also, given that some noise in the communications channel is unavoidable, the receiver must not react instantaneously to every possible LOS event. Multiple indications of LOS over a period of time should be necessary to trigger an LOS indication and to shut down the system.

After converting the incoming light signal to an electric signal, known LOS detection circuits generally use a peak detector to determine when the incoming signal has fallen below a preset threshold. These peak detectors convert the incoming A.C. signal to a D.C. signal using rectifiers such as diodes. The rectified signal is then applied to an external capacitor. The output of the peak detector is applied to a voltage comparator, which determines if the rectified signal is above or below a predefined reference voltage. The reference voltage is usually set using an external resistor.

In functional terms, known LOS detection circuits first detect a peak voltage level, measure the duration of the pulse using a resistor-capacitor time constant, and compare the detected peak voltage with the predefined threshold voltage.

There are several drawbacks with these known circuits. As the detector is a peak detector, it detects the maximum voltage level of the incoming signal. As the typical incoming signal is a square wave, the peak detector measures the initial rising voltage of the signal, which frequently overshoots and exceeds the signal's intended maximum. It is possible that this initial overshoot will trigger the peak detector and prevent the generation of an LOS indication, despite the fact that the true signal amplitude is below the LOS threshold. Failing to shut the system down in such a case is just as undesirable as shutting it down too often.

The external capacitor which is coupled to the integrated peak detector and to the voltage comparator and which maintains the voltage level during pulse transitions introduces a slow analog component into the circuit, which can cause some uncertainty in the circuit's response time, and increases the cost of the circuit. At high bit rates (above 500M-bits/s,) parasitic capacitances and inductances in the peak detector integrated circuit's ("IC"s) package, bond wires, and the external capacitor can trigger a false LOS indication.

The threshold voltage in known systems is defined by an external resistor coupled to the trigger level detector. The sheet resistance of the IC which comprises the peak detector forms part of a voltage expression with the external resistor to insure that the results of both the equation and the resulting circuit are in the proper units. As the sheet resistance varies from part to part and with time, the threshold voltage will drift unless the external resistor is repeatedly trimmed to maintain it.

A need exists for a LOS detector having a very precisely controlled threshold voltage which detector will only respond to a true LOS event but which will also not miss an LOS event due to a voltage overshoot. A completely digital LOS detector is desirable, considering the increasing transmission rates used in fiber-optic communications channels and the desirability of fabricating the LOS detector as a single IC. Eliminating the need to trim the external resistance to maintain the proper threshold voltage is also desirable.

SUMMARY OF THE INVENTION

The present invention, in a first embodiment, comprises a completely digital LOS detector. In this first embodiment, the incoming digital communication signal is supplied to a herein-called "trough" circuit, which has a user defined threshold voltage ("$V_{TH}$") set by 2 external resistors. The trough circuit generates a logic-1 signal whenever the incoming voltage is above or below the $V_{TH}$ and a logic-0 signal whenever the incoming voltage is within $+/- V_{TH}$. The output of the trough circuit represents the presence or absence of the input signal. This output is supplied to a digital "smearing" circuit. The purpose of the smearing circuit is to insure that the output from the LOS detector reliably indicates the presence or absence of an LOS event, and not a brief voltage fluctuation or similar transient.

To further insure that a true LOS event has occurred, a second embodiment of the present invention has a digital state machine coupled to the output of the smearing circuit. This state machine can be used in systems having a clock signal. By using the clock signal, the state machine monitors the output of the smearing circuit and only generates an LOS signal after the smearing circuit has been at a sustained level for a predetermined number of clock cycles.

For purposes of the present invention, an LOS event is defined as the receiver no longer detecting incoming light of sufficient intensity for a sufficient period of time. The receiver which incorporates the present invention includes a light-to-electricity converter as well as amplifiers which amplify the converted signal prior to that signal's transmission to the LOS detector.

The present invention will now be described in detail with reference to the figures listed and described below.

DETAILED DESCRIPTION OF THE PREFERRED EMBODIMENTS

Figure 1:
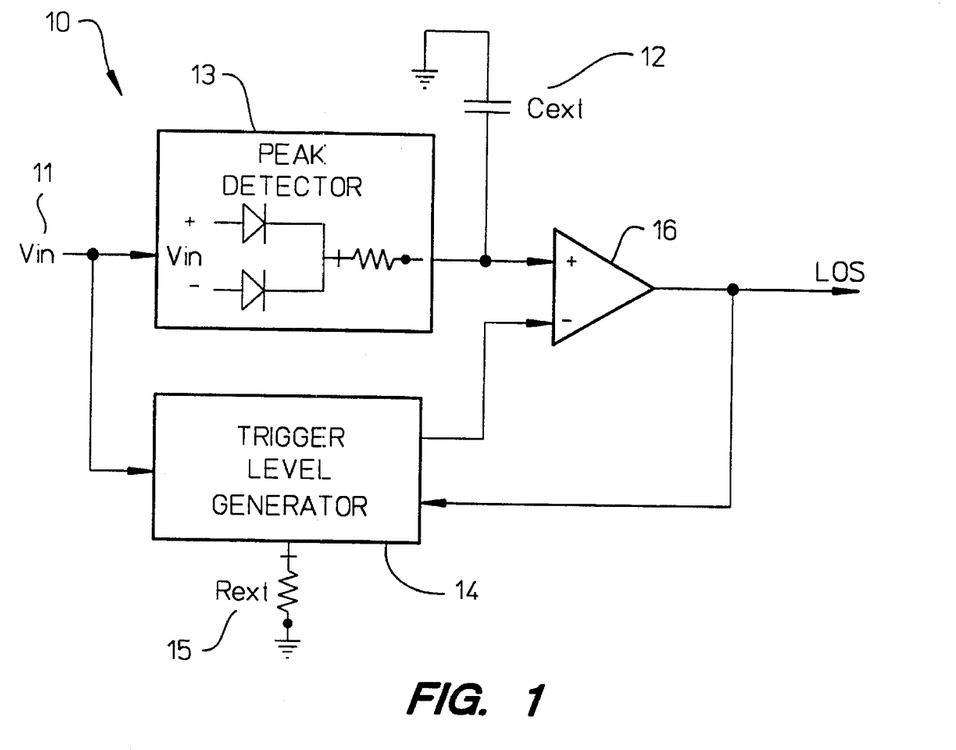
FIG. 1 is a block diagram of a known LOS detector.

FIG. 1 is a block diagram of a known LOS detector 10. A differential incoming communication signal 11 is supplied to peak detector 13, which is comprised of internal diodes and a resistor, and external capacitor 12. The output of peak detector 13 and the output of trigger level generator 14 are supplied to voltage comparator 16, the output of which is used to indicate an LOS event. The trigger level generator's output voltage includes the D.C. bias voltage of signal 11 and the preset threshold voltage at which the LOS is triggered. Often, this threshold voltage is set by $R_{ext}$ 15. The trigger level is adjusted depending on the state of the LOS signal to give the system necessary hysteresis.

The output from the peak detector 13 is a D.C. voltage with at least a slight ripple caused by the charging and discharging of capacitor 12. Because of the output signal's decay from peak detector 13 caused by the discharge of capacitor 12, the level of the output signal is somewhat ambiguous and depends on the number of consecutive 0s and 1s that occur (the greater the number of 0s, the longer capacitor 12 discharges). Additionally, the presence of external capacitor 12 increases the cost of the circuit. The use of a peak detector may also result in the failure to generate an LOS indication in those cases where the incoming signal overshoots its intended voltage momentarily.

Figure 2:
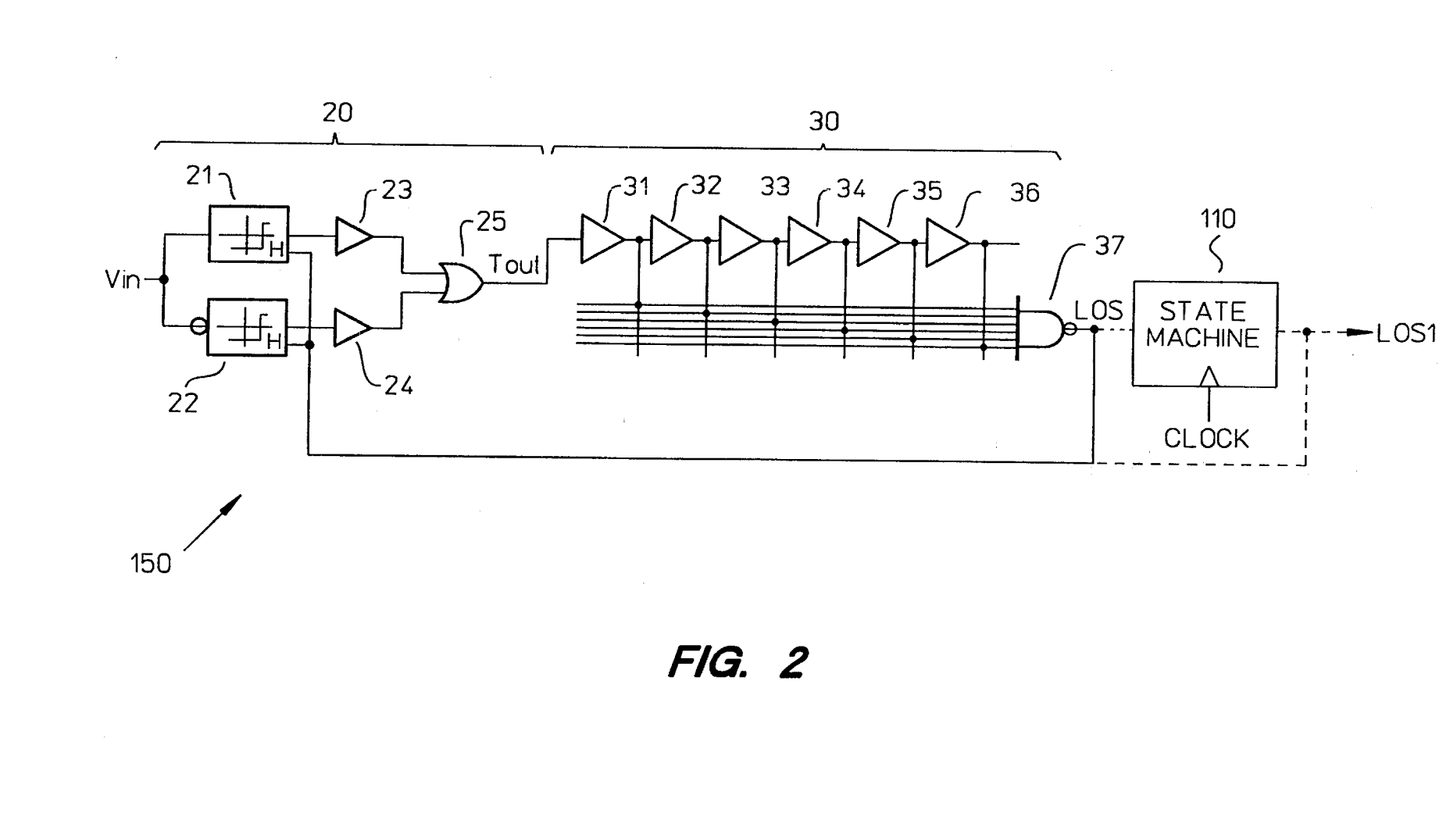
FIG. 2 is a block diagram of the first and second embodiments of the present invention.

FIG. 2 is a block diagram of a first and second embodiment of the present invention. Digital LOS detector 150 is comprised of a trough circuit 20 and a smearing circuit 30. In a second embodiment, state machine 110 can be coupled to the output of smearing circuit 30 in any environment where a clock signal is available. The state machine uses the clock signal to insure further that the output of smearing circuit 30 remains at the same logic level for a sufficiently long time to verify that the presence or absence of a LOS condition has occurred. The connection of state machine 110 to the first embodiment of the present invention is shown in FIG. 2, indicated by dotted lines. Instead of the output of gate 37 being coupled to trough circuit 20, it is instead coupled to state machine 110, the output of which is coupled back to trough circuit 20.

Figure 3:
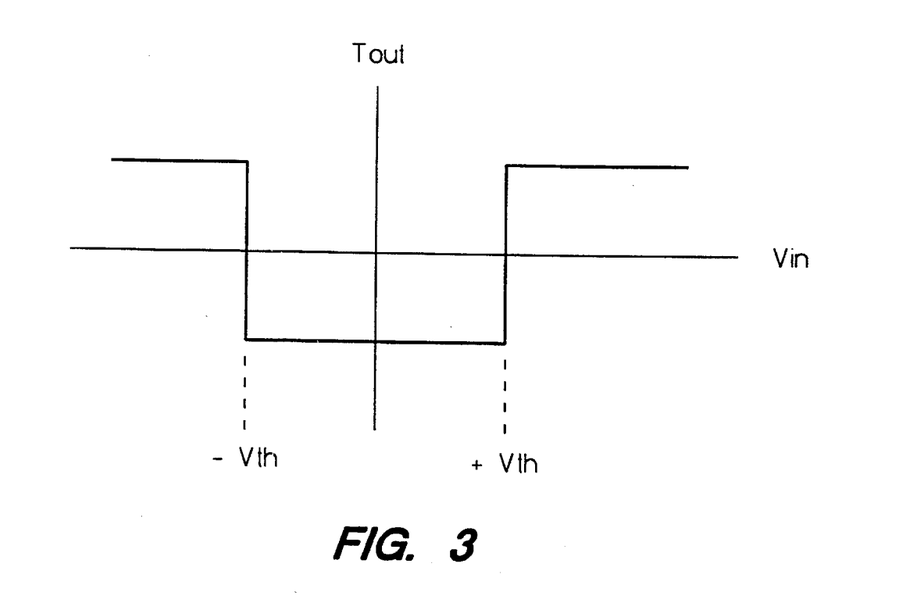
FIG. 3 shows the transfer function of the trough circuit shown in FIG. 2.

The transfer function of trough circuit 20 is shown in FIG. 3. The incoming communications signal is a digital communication square wave with finite rise and fall times. When $|V_{in}|$ of this signal is less than $V_{TH}$, $T_{out}$ of trough circuit 20 is logic-0. When $|V_{in}|$ is greater than $V_{TH}$, $T_{out}$ of trough circuit 20 is logic-1. In this embodiment of the present invention, trough circuit 20 is further comprised of upper threshold detector 21, lower threshold detector 22, amplifiers 23 and 24 and OR gate 25.

Figure 4:
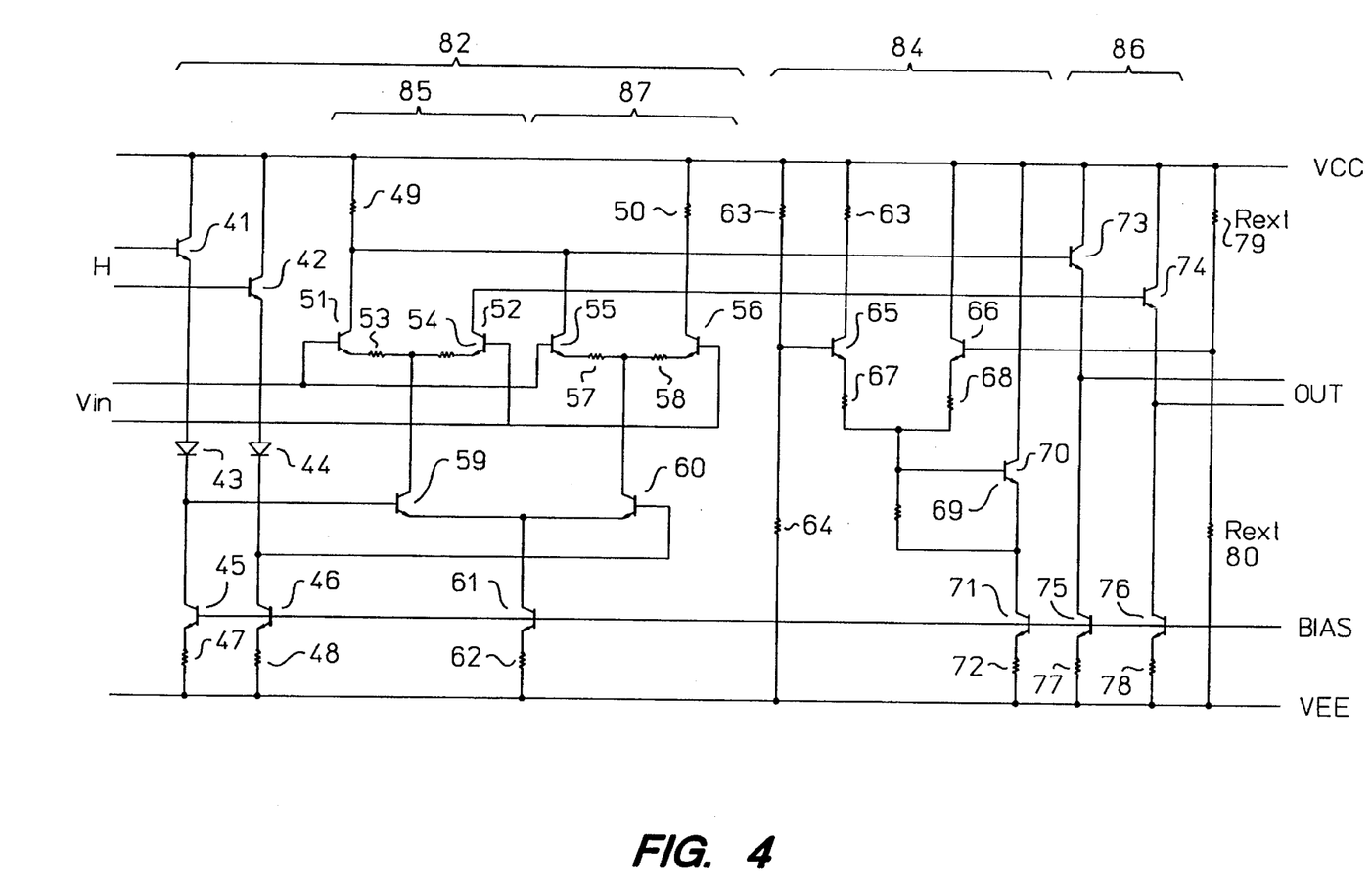
FIG. 4 is a schematic drawing of the trough circuit shown in FIG. 2.

FIG. 4 is schematic drawing of upper threshold detector 21. Detector 21 is comprised of an amplifier section 82, comprised of two differential current amplifiers 85 and 87, variable current source 84, and output stage buffers 86. As the construction and operation of lower threshold detector 22 is identical to that of upper threshold detector 21, with the exception that the input signal to lower threshold detector 22 is inverted with respect to threshold detector 21's input, only the design and operation of upper threshold detector 21 will be discussed in detail.

The two differential amplifiers 85 and 87 have different gains. Establishing the gains of differential amplifiers 85 and 87 is done in a known manner by properly selecting the value of their collector and emitter resistances. The collectors of amplifiers 85 and 87 share the same load resistors 49 and 50. This arrangement creates the functional equivalent of a voltage amplifier with two different gains. Depending on the state of the LOS output (LOS or LOS1, FIG. 2, depending upon whether state machine 110 is present or not), either amplifier 85 or amplifier 87 is activated and the other amplifier is tri-stated. When the output of smearing circuit 30 or state machine 110 indicates an LOS condition, the amplifier with the lower gain is turned on. This in turn requires that $V_{in}$ reach a higher level before the LOS condition will be removed. Alternatively, if there is no LOS, the higher gain amplifier turns on. $V_{in}$ must fall further in this case before an LOS condition is triggered. This provides the necessary hysteresis for the present invention. As the gain ratio of the two amplifiers is very well defined, the hysteresis in dB is a constant, independent of the threshold voltage $V_{TH}$. Note that FIG. 3 shows the transfer function of trough circuit 30 when the higher gain differential amplifier is on. If the lower gain differential amplifier is on, the transfer function is similar, with a different $V_{TH}$.

$V_{TH}$ is determined by applying the current generated by the adjustable D.C. current source 84 to load resistor 50. This creates a D.C. offset in the trigger voltage for the trough circuit, which gives rise to half the transfer function shown in FIG. 3. The other half of the transfer function is generated by the lower threshold detector 22.

Adjustable current source 84 comprises a current source and a steering circuit. The current source is comprised of transistors 70 and 71 and resistors 69 and 72. The values of these components are selected to provide the desired temperature coefficient to compensate for gain variations in amplifiers 85 and 87, as well as in the amplifiers whose output is provided to LOS detector 150. The current generated by the current source is steered by a steering circuit comprised of transistors 65 and 66 and resistors 63, 64, 67, 68 and external resistors 79 and 80.

The difference in the voltages applied to the bases of transistors 65 and 66 steers a variable amount of the current generated by adjustable current source 84 through resistor 50, which in turn determines the offset voltage of differential amplifiers 85 and 87.

As the voltage difference is determined by the ratio of the internal resistors 63 and 64 to external resistors 79 and 80, the absolute value of the IC's sheet resistance is decoupled from that of the external resistors, allowing an even more precise setting of $V_{TH}$. Although it is more difficult to fabricate resistors of a precise value using known IC fabrication techniques, the ratio of their values can easily be very tightly controlled.

Output stage 86 buffers the differential signals generated by amplifiers 85 or 87 and is coupled in turn to amplifier 23 (FIG. 2) which sharpens the signal to more closely reasonable a square wave, and finally to OR gate 25. The design and construction of amplifier 23 is known. The design and operation of the logic circuitry needed to generate a logic signal whenever detectors 21 and 22 detect a transition in voltage level going through $V_{TH}$ is known.

Transitions in $V_{in}$ detected by trough circuit 20 generate a short logic-0 output. However, individually these short pulses are not indicative of a LOS event. Only if the output of trough circuit 20 remains at a logic-0 level for at least a certain minimum of time should an LOS signal be generated. As the transitions in $V_{in}$ and the consequent pulses generated by trough circuit 20 cannot exceed the bit width of $V_{in}$, the width of the pulses generated by trough circuit 20 in normal, non-LOS operation is less than one bit period of $V_{in}$.

Smearing circuit 30 (FIG. 2) performs the necessary filtering of the output of trough circuit 20. Circuit 30 functions by successively delaying the input pulses and recombining these delayed input pulses with the original input pulse. Only if the output of trough 20 remains low for at least the same amount of time as the total delay path is a high output generated by smearing circuit 30. As this total delay path time exceeds the maximum pulse width generated by trough circuit 20 in a non-LOS situation, smearing circuit 30 will only generate a positive output when a definite LOS condition has occurred. Thus the output of smearing circuit 30 is the true indication of an LOS event. The exact number of delay elements will vary depending upon the bit rate of the incoming signal. In a system using a 500M-bit data rate, the signal's period is 2 nanoseconds. Therefore, the total length of the delay is 2 nanoseconds. In such a system, only if the output from trough circuit 20 has been at logic-0 for at least 2 nanoseconds will the output of smearing circuit 30 be a logic-1. The illustrated preferred embodiment uses 6 delay elements 31 through 36. The output of each delay element is supplied to the next delay element and to NAND logic gate 37 to generate the final output. Other logic gates could be used and the implementation of this circuit function with such gates would be routine. If the bit rate of the incoming signal was changed, changes in the number of delay elements might also be necessary. Such changes would be a routine matter given this detailed description of the present invention.

In systems where a clock signal is available and the clock frequency is less than or equal to the data rate of $V_{in}$, a state machine 110 (see FIGS. 2 and 6) can be incorporated into the present invention to enhance the output of the smearing circuit, making it even more robust. This state machine monitors the input signal from smearing circuit 30 more closely to insure that only true LOS events of a certain minimum duration trigger a high output from the present invention.

Figure 5:
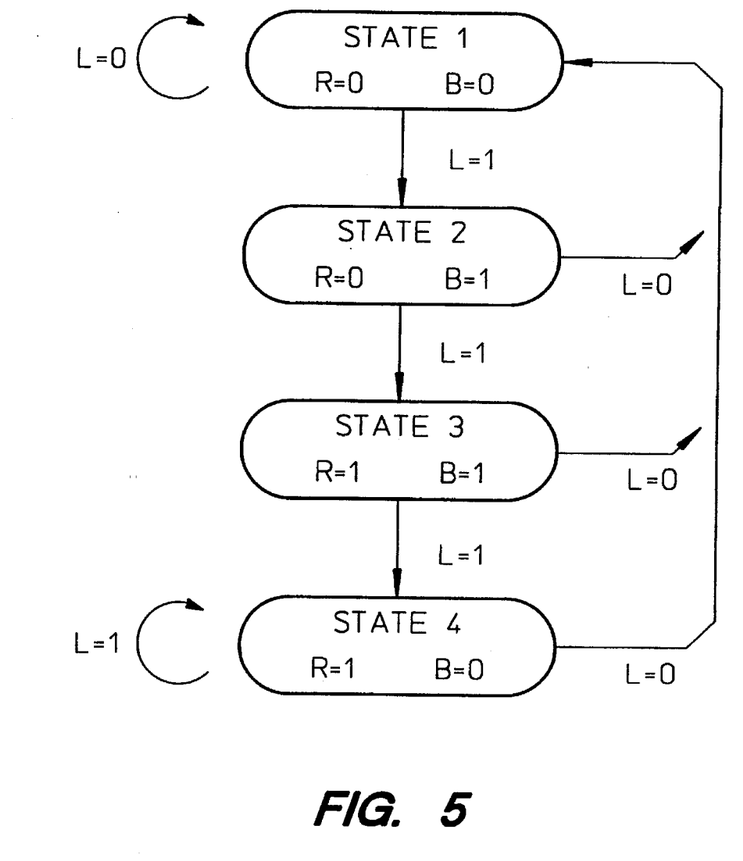
FIG. 5 is a state diagram of the state machine shown in FIG. 2.
Figure 6:
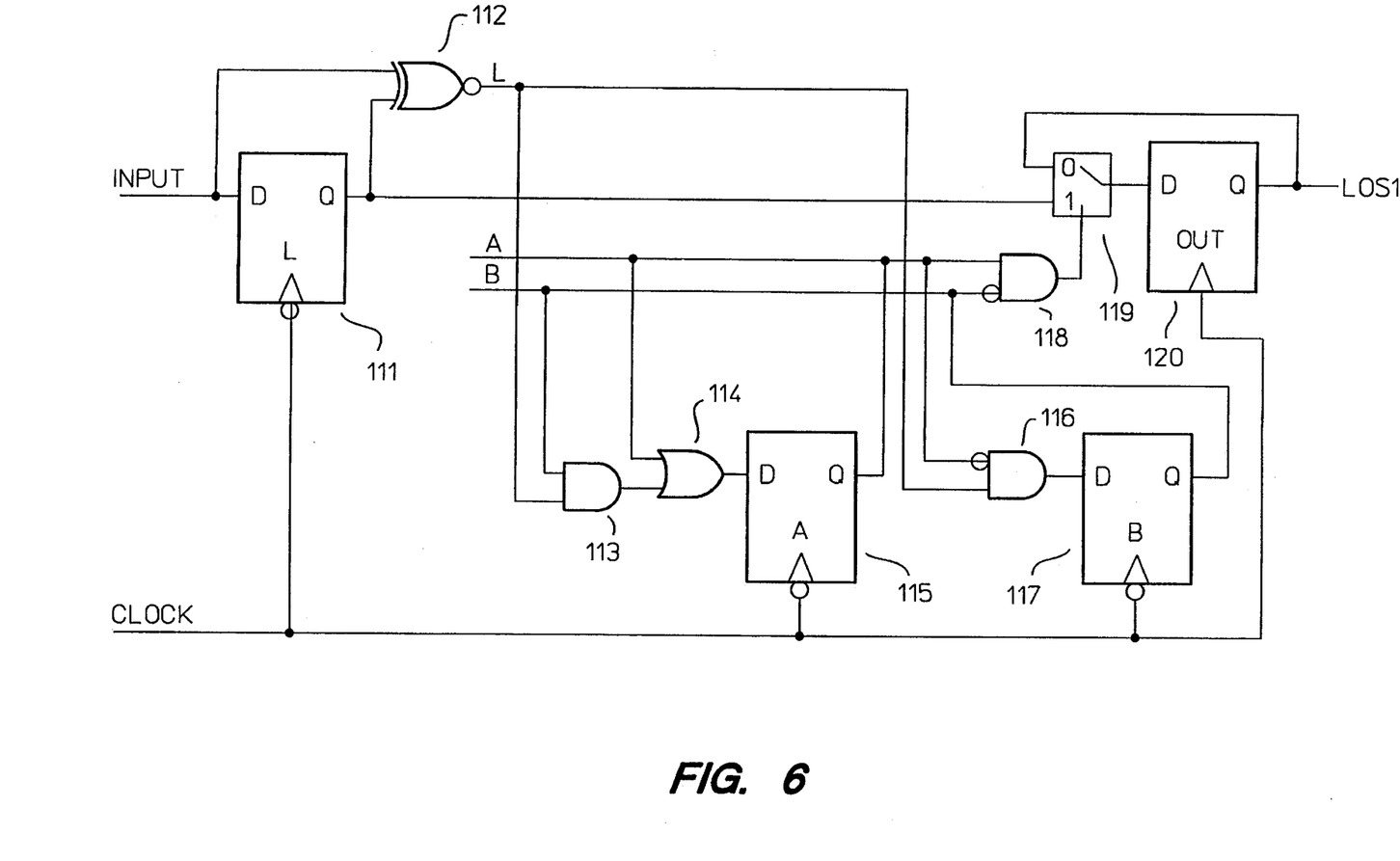
FIG. 6 is a logic circuit diagram showing one realization of the state machine.

The state diagram shown in FIG. 5 indicates how state machine 110 monitors the input signal from smearing circuit 30 and does not change state unless the input signal is sustained for four consecutive clock cycles. FIG. 6 shows one logic circuit embodying the state diagram of FIG. 5. The generation of a logic circuit from a state diagram is a known process and the logic circuit shown in FIG. 6 is only one embodiment of the state diagram of FIG. 5. Many others could be used and their design would be known to one of skill in the art. Indeed, even an analog output stage such as a capacitor could be coupled to the output of smearing circuit 30 to perform the same function as state machine 110.

Figure 7:
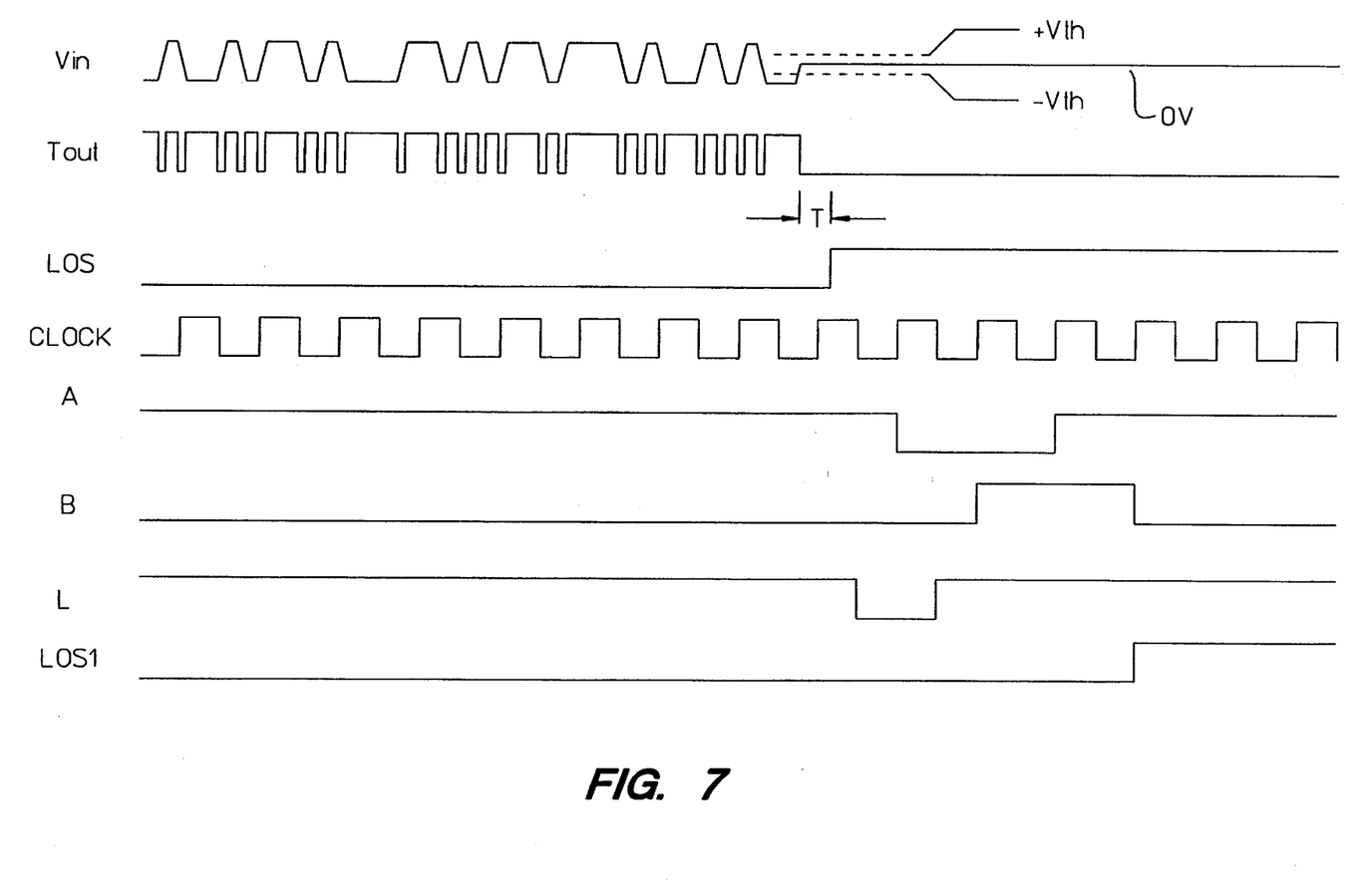
FIG. 7 is a timing diagram showing how the present invention functions in response to an LOS event.

The performance of the present invention in operation is illustrated in FIG. 7. $V_{in}$ is the signal applied to trough circuit 20, $T_{out}$ is the output of trough circuit 20, LOS is the output of smearing circuit 30, A, B, and L are outputs generated within state machine 110, and LOS1 is the output of state machine 110. As shown by FIG. 7, trough circuit 20 generates a short pulse every time $V_{in}$ transitions between a first and second state. LOS from smearing circuit 30 is not generated until $T_{out}$ has been low for a minimum period T. LOS1 does not go to its logic-1 state until 5 clock cycles have passed since LOS has gone to its logic-1 state.

I claim:

1. A system for determining the loss of an incoming digital signal, the system comprising:

a trough circuit for determining when the incoming digital signal transitions between a first signal level and a second signal level and for generating a first output signal whenever the incoming digital signal transitions from the first level to the second level and from the second level to the first level; and a smearing circuit coupled to the trough circuit for receiving the first output signal and for generating a second output signal if the first output signal is generated for longer than a first predefined period of time, and wherein the trough circuit further comprises:

an amplifier with first and second selectable gain levels for receiving the incoming signal and amplifying it as the signal transitions from the first signal level through a first threshold signal level to the second signal level and from the second signal level through a second threshold signal level to the first signal level, the gain selected depending on the output of the smearing circuit;

a constant current generator for generating a constant current; and a current steering circuit coupled to the constant current generator and to the amplifier for steering a variable amount of the constant current through a load resistor to establish the first and second threshold signal levels.

2. The system of claim 1 wherein the amplifier means comprises two differential amplifiers having different gains.

3. The system of claim 1 wherein the trough circuit is comprised of two identical trough circuits, the first trough circuit receiving the digital signal and the second trough circuit receiving an inverted digital signal.

4. The system of claim 3 wherein the output of each trough circuit is coupled to an amplifier for sharpening the trough circuits' output.

5. A Loss-Of-Signal detector comprising:

a trough circuit coupled to a digital signal input and receiving a digital signal, the trough circuit detecting each transition in the digital signal between a first signal level and a second signal level, the trough circuit generating a logic output each time the digital signal transitions between the first and second signal level; and a smearing circuit coupled to the output of the trough circuit, the smearing circuit generating a plurality of time delayed logic signals from each successive logic output signal from the trough circuit, the smearing circuit generating the Loss-Of-Signal output whenever an output signal and all its time delayed signals are at the same logic state simultaneously, the trough circuit further comprising:

a first differential amplifier coupled to the digital signal input and the Loss-Of-Signal output for generating a logic signal in response to a first Loss-Of-Signal output state;

a second differential amplifier coupled to the digital signal input and the Loss-Of-Signal output for generating a logic signal in response to a second Loss-Of-Signal output state;

constant current source for generating a constant current; and a steering circuit coupled to the constant current source and to the first and second differential amplifiers for steering a variable amount of the constant current through a load resistor to determine a threshold voltage for each of the first and second differential amplifiers.

6. The Loss-Of-Signal detector of claim 5 wherein the smearing circuit is comprised of a plurality of delay means, each delay means having an input and an output, the input of a first delay means being coupled to the output of the trough circuit, the output of the first delay means being coupled to the input of a successive delay means, the input of each successive delay means being coupled to the output of the previous delay means, the output of each delay means also being coupled to an NAND gate, the NAND gate generating the Loss-Of-Signal output if the output of all the delay means are at the same logic state simultaneously.

7. The Loss-Of-Signal detector of claim 6 wherein the total time delay between when a logic signal is received by the first delay means and when a time delayed logic signal is generated by the last delay means exceeds the time required for the digital signal to transition between the first and second voltage levels.

8. The Loss-Of-Signal detector of claim 5 wherein the first and second differential amplifier means are coupled respectively to a first and second output buffer circuit.

* * * * *